US005533901A

United States Patent [19]

[11] Patent Number: 5,533,901

[45] Date of Patent: Jul. 9, 1996

Hunt et al.

[54] ELECTRICAL CONNECTOR WITH CONTACT ALIGNMENT MEMBER

[75] Inventors: James A. Hunt, Harrisburg; Martha L. Rupert, Hummelstown; David L. Brockway, Mechanicsburg; Douglas G. Fisher, Boiling Springs; Ronald J. Baker; David M. Swartz, both of York, all of Pa.

[73] Assignee: The Whitaker Corporation, Wilmington, Del.

[21] Appl. No.: 449,607

[22] Filed: May 23, 1995

[51] Int. Cl.$^{6}$ .............................. H01R 9/09; H05K 1/00

[52] U.S. Cl. .............................. 439/79; 439/947

[58] Field of Search .............................. 439/78, 79, 80, 439/83, 892, 149, 150

[56] References Cited

U.S. PATENT DOCUMENTS

| | | | |
|---|---|---|---|
| 4,080,041 | 3/1978 | Hawkins, Jr. | 439/79 |
| 4,469,387 | 9/1984 | McHugh | 439/140 |
| 4,583,807 | 4/1986 | Kaufman et al. | 439/83 |
| 4,676,565 | 6/1987 | Reichardt | 439/79 |
| 4,826,442 | 5/1989 | Douty et al. | 439/92 |
| 5,004,430 | 4/1991 | DelGuidice et al. | 439/350 |
| 5,129,832 | 7/1992 | Marsh et al. | 439/79 |
| 5,133,670 | 7/1992 | Doi et al. | 439/79 |
| 5,192,215 | 3/1993 | Grabbe et al. | 439/73 |
| 5,194,017 | 3/1993 | Consoli | 439/492 |
| 5,201,664 | 4/1993 | Korsunsky et al. | 439/892 |
| 5,219,295 | 6/1993 | Niwa et al. | 439/79 |
| 5,348,488 | 9/1994 | Green et al. | 439/892 |

FOREIGN PATENT DOCUMENTS 1-279581 11/1989 Japan .

*Primary Examiner*—Neil Abrams
*Assistant Examiner*—Barry Matthew L. Standig
*Attorney, Agent, or Firm*—Anton P. Ness

[57] ABSTRACT

An electrical connector (1) comprises, a housing (4), a mating face (6) on the housing (4), multiple electrical contacts (7) in the housing (4), terminals (8) on the contacts (7) projecting from the housing (4) for connection with a circuit board, and an insulating alignment member (28) biasing the terminals (8), and a base portion (26) on the housing (4) adapting the connector (1) for vertical mounting and, alternatively, for right angle mounting to a circuit board.

3 Claims, 5 Drawing Sheets

ELECTRICAL CONNECTOR WITH CONTACT ALIGNMENT MEMBER

FIELD OF THE INVENTION

The invention relates to an electrical connector with conductive electrical contacts for connection with a circuit board, and more particularly, to an electrical connector with conductive electrical contacts and an alignment member for aligning the contacts relative to the circuit board.

BACKGROUND OF THE INVENTION

U.S. Pat. No. 5,133,670 describes an electrical connector comprising, an insulating housing and electrical contacts in the housing. Electrical terminals on the contacts project from the housing for connection with a circuit board. An alignment member aligns the electrical terminals. Channels in the alignment member receive respective terminals, and urge the terminals into a predetermined and spaced apart alignment. The alignment member also urges the terminals into a common plane. The alignment member is assembled to the housing with a force fit.

U.S. Pat. No. 5,037,334 discloses an electrical connector comprising, an insulating housing, and an alignment member for aligning electrical terminals that project from the housing. Openings through the alignment member receive and align respective terminals. The alignment member and the housing are fabricated as one piece.

Each of the connectors described in the patents is a right angle connector, so named because the circuit board and a mating face on the connector are perpendicular to each other. The terminals on respective contacts emerge from the housing of the connector, and are bent along their lengths to extend downward toward the circuit board.

A vertical mount connector is so named because the mating face on the connector extends parallel to the circuit board and is elevated vertically above the circuit board. The terminals on respective contacts emerge from the housing and extend straight from the housing vertically downward to the circuit board.

Heretofore, before the invention, a housing for a right angle connector was fabricated with a different construction when compared with a housing for a vertical mount connector. The right angle connector used a contact alignment member that differed in construction from a contact alignment member for a vertical mount connector.

SUMMARY OF THE INVENTION

The invention resides in an electrical connector comprising, an insulating housing adapted with a vertical mount construction and adapted with a right angle construction, and adapted with a construction for attaching a contact alignment member in either of two locations on the same housing.

An advantage of the invention resides in an electrical connector comprising a housing that can be used as a right angle or a vertical mount, and for attaching a contact alignment member in either of two locations on the housing.

An embodiment of the invention will now be described by way of example with reference to the accompanying drawings, according to which:

DETAILED DESCRIPTION

Figure 1:
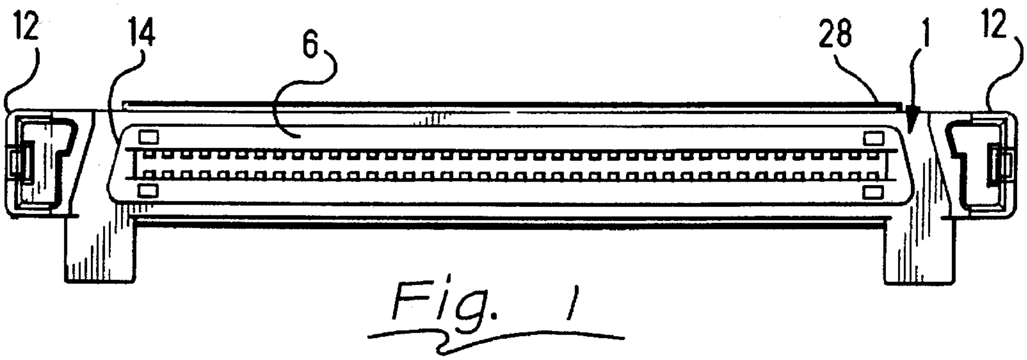
FIG. 1 is a top view of an electrical connector comprising a housing adapted with a vertical mount construction and a contact alignment member.
Figure 2:
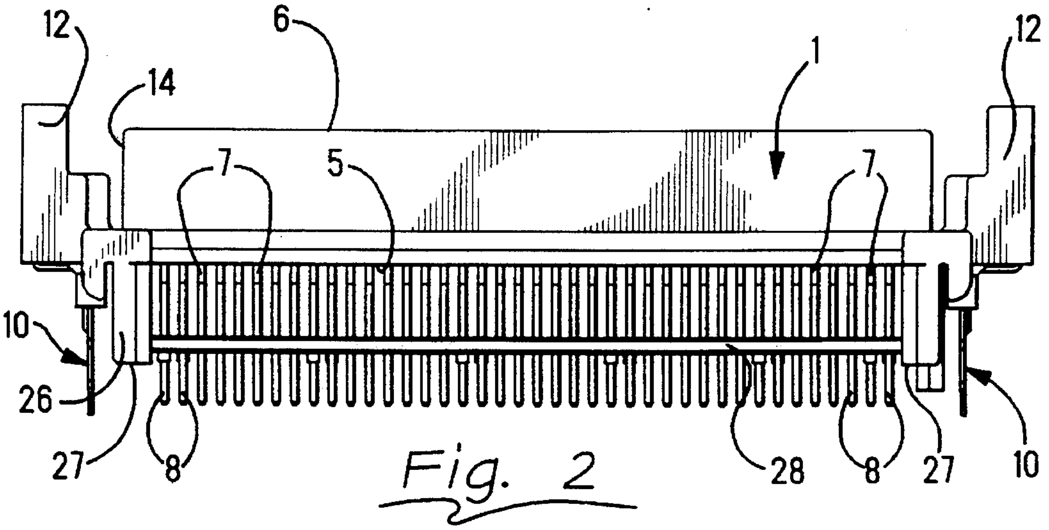
FIG. 2 is a side view of the connector shown in FIG. 1.

With reference to FIGS. 1–5 and 9, an electrical connector 1 comprises, an insulating housing 4 having a rear face 5 and a mating face 6; electrical contacts 7 in and extending through contact receiving cavities that extend through the housing 4 from the rear face 5 toward and to the mating face 6.

Figure 3:
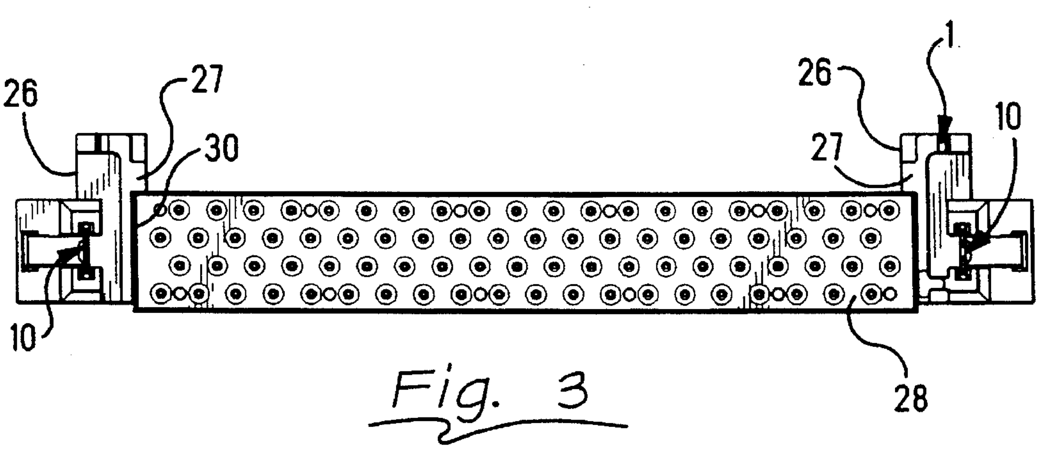
FIG. 3 is a bottom view of the connector shown in FIG. 1.
Figure 5:
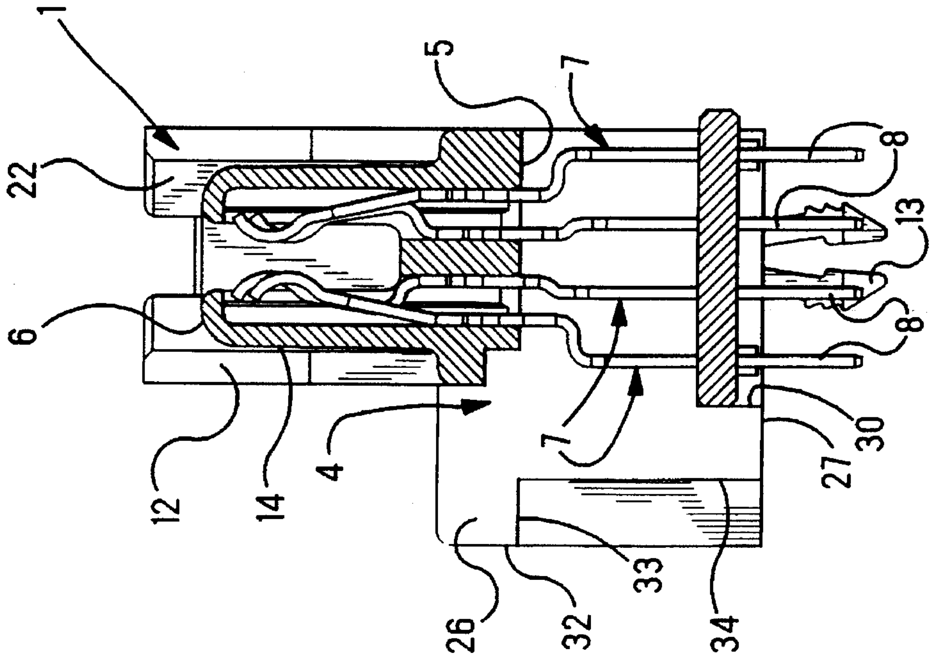
FIG. 5 is an enlarged section view of another portion of the connector shown in FIG. 2.
Figure 7:
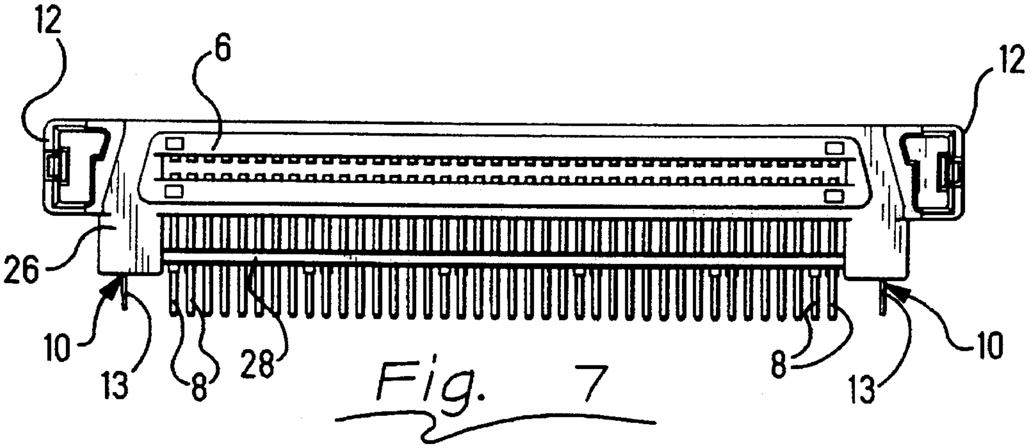
FIG. 7 is a front view of the connector as shown in FIG. 6.
Figure 8:
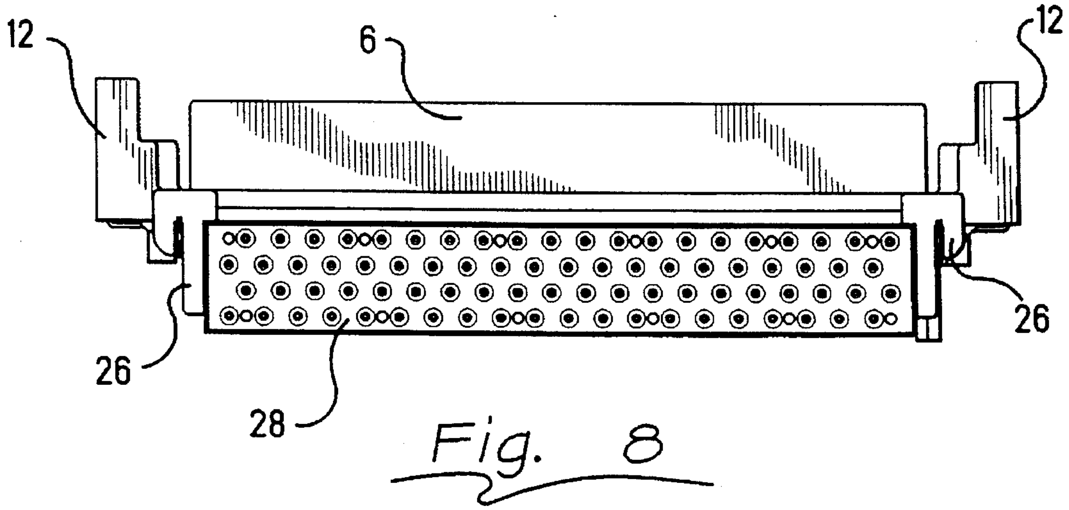
FIG. 8 is a bottom view of the connector as shown in FIG. 6.

The electrical connector 1 further comprises; electrical terminals 8 on rear ends of the electrical contacts 7 that project from the rear face 5 for connection to a circuit board, not shown. The connector 1 further comprises, electrical ground contacts 10, FIGS. 11–14, extending in and through ground contact receiving cavities 11, FIGS. 4 and 10, in the housing 4. Electrical terminals 13 on the ground contacts 10 project from the rear face 5 of the housing 4 for connection to a circuit board, not shown. A shroud 14 on the housing 4 encircles the contacts 7 at the mating face 6. The cavities 11 are in the form of channels in the connector 1. The ground contacts 10 are in grooved recesses of the channels, and face opposite open sides of the channels. The channels define opposite ends 18 of the respective, connector 1. An insulating funnel 22 is on the open end of each of the ground contact receiving cavities 11 in the connector 1. With reference to FIGS. 1, 3 and 7, the electrical connector 1, is an electrical receptacle connector having the cavities 11 and the ground contacts 10 projecting in the same direction as the mating face 6 to establish a ground connection of the ground contacts 10 to mating ground contacts, not shown, of another mating electrical connector, not shown. Further details of the connector 1 and of the mating electrical connector are disclosed in U.S.A. patent application Ser. No. 08/250,204, filed May 27, 1994.

Figure 4:
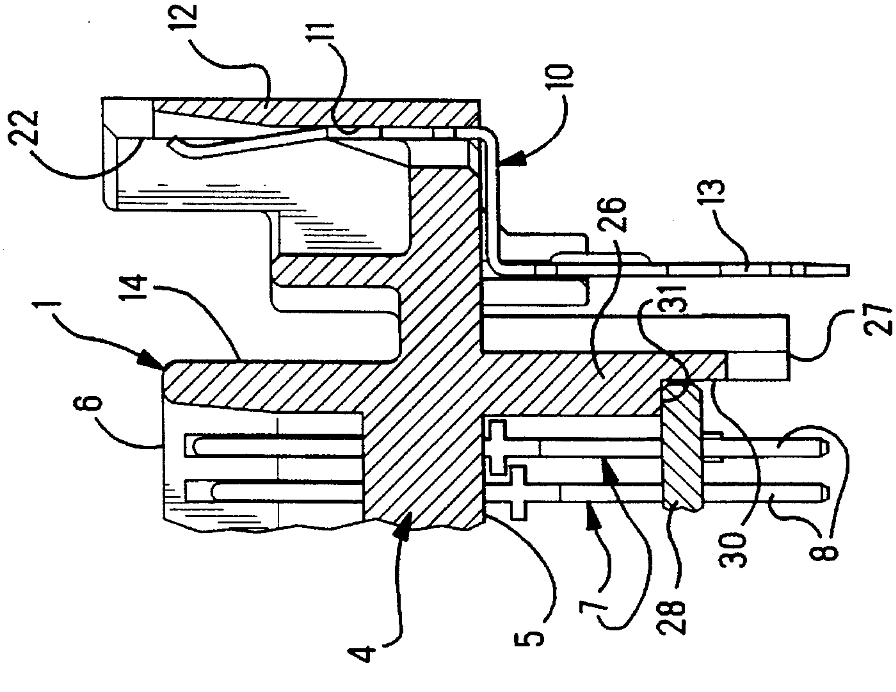
FIG. 4 is an enlarged section view of a portion of the connector shown in FIG. 1.
Figure 6:
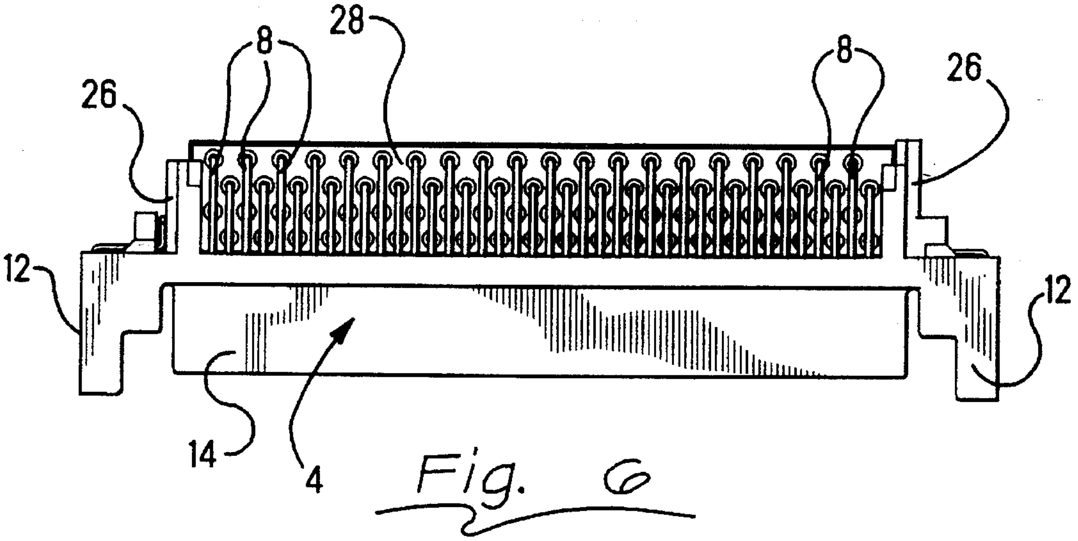
FIG. 6 is a top view of an electrical connector with the same housing, as shown in FIG. 1, and adapted with a right angle construction.
Figure 11:
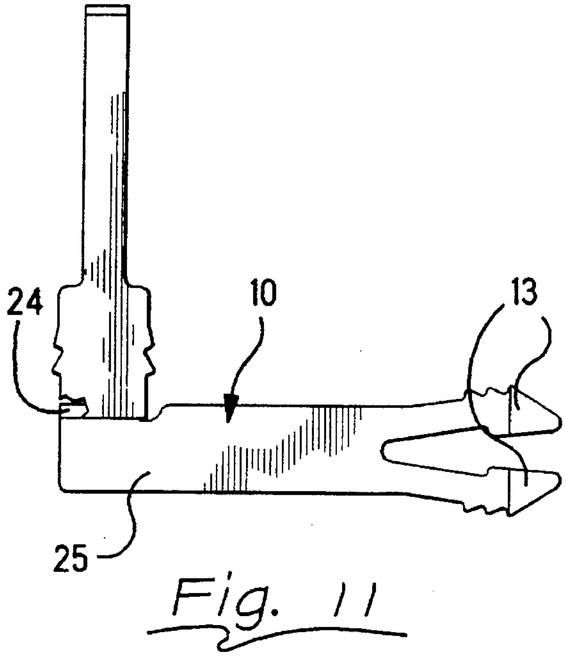
FIG. 11–14 are views of a ground contact for use in the connector.
Figure 12:
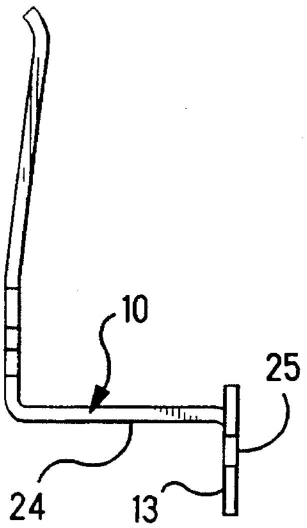
Figure 13:
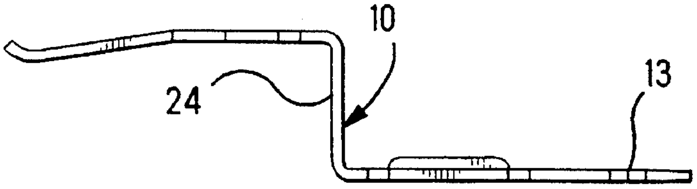

With reference to FIGS. 11–14, each of the ground contacts 10 is stamped and formed from a blank of metal and is unitary with a carrier strip 23. Each ground contact 10 is separated from the carrier strip 23. With reference to FIGS. 4 and 13, the ground contact 10 has a first offset portion 24 that extends along the rear face 5. The terminal 13 extends rearward of the rear face 5 in a first direction that is perpendicular to the mating face 5.

Figure 10:
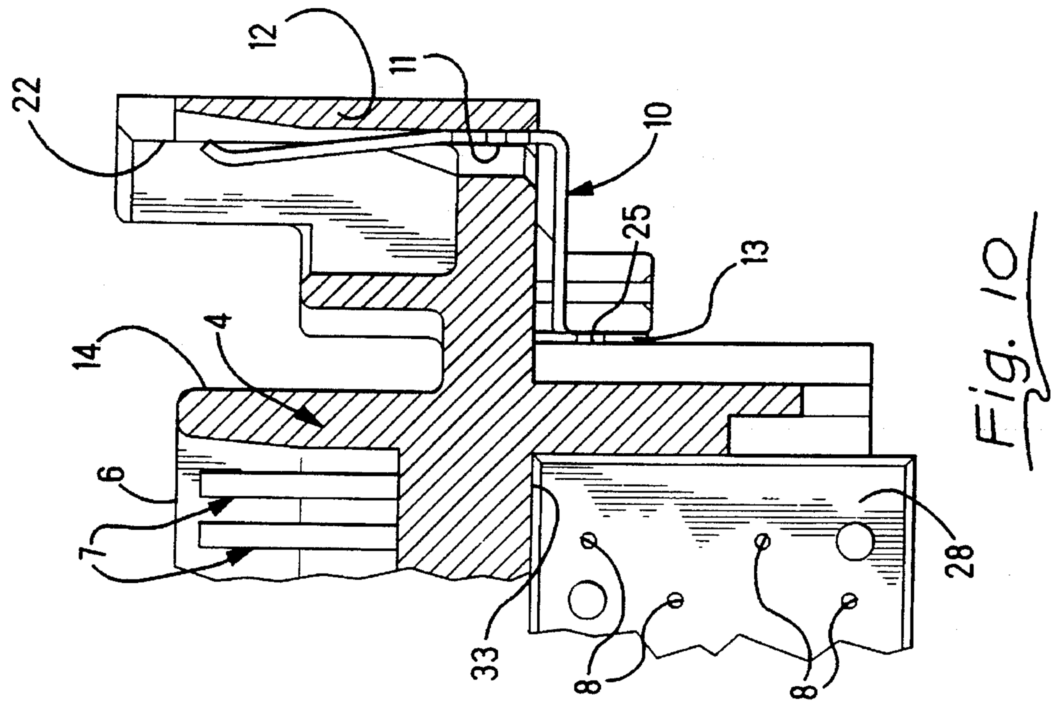
FIG. 10 is an enlarged section view of another portion of the connector shown in FIG. 6.
Figure 9:
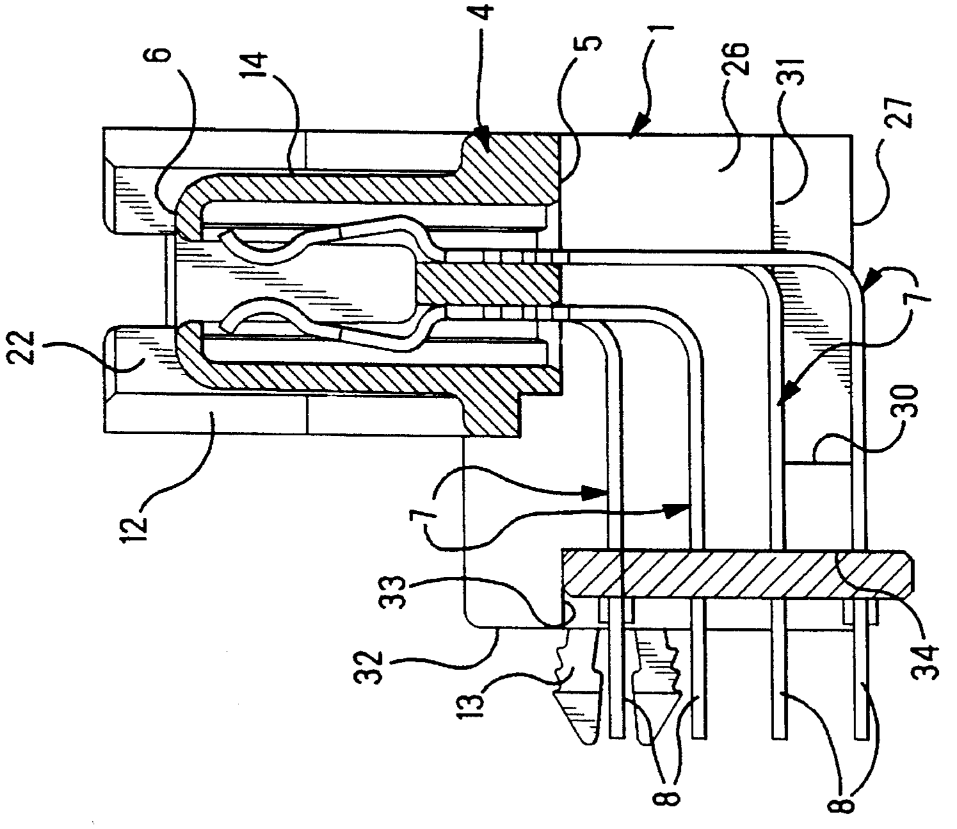
FIG. 9 is an enlarged section view of a portion of the connector shown in FIG. 6.

With reference to FIGS. 10–12, the ground contact 10 has the first offset portion 24 and a second offset portion 25 portion, perpendicular to the first offset portion 24. The terminal 13 extends from the rear face 5 in a second direction that is perpendicular to the first direction. As shown in FIG. 10, the second direction is parallel to the mating face 6.

The housing 4 is of unitary construction with a base portion 26 rearward of the mating face 6. The base portion 26 adapts the connector 1 as a vertical mount connector or a right angle connector. The connector 1 is adapted as a vertical mount connector, as shown in FIGS. 1–5. With reference to FIGS. 1–5, a first mounting surface 27 on the base portion 26 is parallel to the mating face 6. The first mounting surface 27 is adapted to engage a circuit board, not shown, to mount the connector 1 as a vertical mount connector. A vertical mount connector is so named because the mating face 6 on the connector 1 extends parallel to the circuit board and is elevated vertically above the circuit board. The terminals 8 on respective contacts 7 emerge from the housing 4 and extend straight from the housing 4 vertically downward to the circuit board. The terminals 8 project rearward of the rear face 5 in a first direction that is perpendicular to the mating face 6, to extend beyond the first mounting surface 27 for plugging into the circuit board, not shown.

An insulating alignment member 28 aligns the electrical terminals 8. The terminals 8 extend through openings 29 through the alignment member 28. The alignment member 28 receives the terminals 8 through respective openings 29, and urges the terminals 8 into a predetermined and spaced apart alignment. The alignment member is recessed from the first mounting surface 27 by being received in a first recess 30 in the base portion 26 on the housing 4. The alignment member 28 registers against a corresponding lip 31 in the first recess 30. The lip 31 retains the alignment member 28 in desired position relative to the housing 4.

The connector 1 is adapted as a right angle connector, as shown in FIGS. 6–10. A right angle connector is so named, because a mating face on the connector and a circuit board, on which the connector is mounted, are perpendicular to each other. The terminals 8 on respective contacts 7 emerge from the rear face 5 on the housing 4 of the connector 1, and are bent along their lengths to extend downward toward the circuit board, not shown. With reference to FIGS. 6–10, a second mounting surface 32 is on the base portion 26. The second mounting surface 32 is perpendicular to the mating face 6. The second mounting surface 32 is adapted to engage a circuit board, not shown, to mount the connector 1 as a right angle connector. The terminals 8 project rearward of the rear face 5, and are bent along their lengths to extend in a second direction perpendicular to the first direction, and parallel to the mating face 6, to extend beyond the second mounting surface 32 for plugging connection with a circuit board, not shown.

The alignment member 28 receives the terminals 8 through respective openings 29, and urges the terminals 8 into a predetermined and spaced apart alignment. The alignment member 28 is recessed from the second mounting surface 32 by being received in a second recess 33 in the base portion 26 on the housing 4. The alignment member 28 registers against a corresponding lip 34 in the second recess 33. The lip 34 retains the alignment member 28 in desired position relative to the housing 4. The terminals 8 extend in the first direction when the alignment member 28 is against the corresponding first lip 31 in the first recess 30, and the terminals 8 extend in a second direction perpendicular to the first direction when the alignment member 28 is against the corresponding second lip 34 in the second recess 33.

Figure 14:
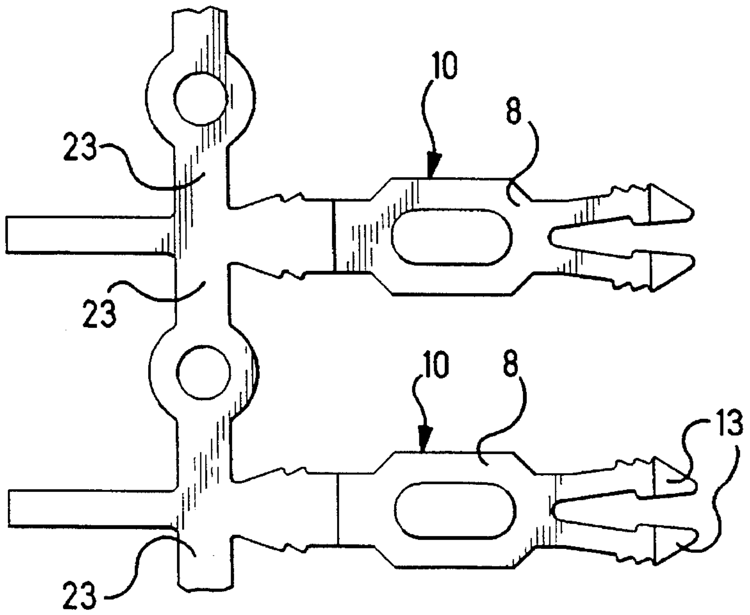

With reference to FIGS. 13 and 14, the ground contact 10 for the vertical mount version of the connector 3 (FIGS. 1 to 5) is provided with the offset portion 24 connecting the terminal 13 and the remainder of the ground contact 10, to offset the terminal 13 from the remainder of the ground contact 10. Similarly, with reference to FIGS. 11 and 12, the ground contact 10 for the right angle version of the connector 3, shown in FIG. 6 to 10, is provided with the offset portions 24 and 25.

Other embodiments, features and advantages of the invention are intended to be covered by the spirit and scope of the appended claims.

What is claimed is:

1. An electrical connector comprising:

an insulating housing, a mating face on the housing, multiple electrical contacts in the housing, terminals on the contacts projecting from the housing for connection with a circuit board on which the housing is mounted, and an insulating alignment member biasing the terminals into spaced apart alignment, and further wherein, a recessed lip is along a first recess in the housing behind the mating face, a second recessed lip is along a second recess in the housing, the second lip extends perpendicular to the first lip, the alignment member fits alternatively in the first recess or in the second recess and against the corresponding first lip or the corresponding second lip, when the terminals extend respectively in a first direction from the housing or in a second direction perpendicular to the first direction.

2. An electrical connector comprising:

an insulating housing, a mating face on the housing, multiple electrical contacts in the housing, terminals on the contacts projecting from the housing for connection with a circuit board on which the housing is mounted, and an insulating alignment member biasing the terminals into spaced apart alignment, and further wherein, a recessed lip is on the housing behind the mating face, a second recessed lip is on the housing, the second lip extends perpendicular to the first lip, the alignment member registers alternatively against the corresponding first lip or the corresponding second lip, when the terminals extend respectively in a first direction from the housing or in a second direction perpendicular to the first direction.

3. An electrical connector as recited in claim 2 wherein, the first lip is in a first recess in the housing and the second lip is in a second recess in the housing.

* * * * *